United States Patent
Moehrle et al.

(10) Patent No.: US 10,923,879 B2
(45) Date of Patent: Feb. 16, 2021

(54) METHOD FOR FABRICATING AN ELCTRO-ABSORPTION MODULATED LASER AND ELECTRO-ABSORPTION MODULATED LASER

(71) Applicant: FRAUNHOFER-GESELLSCHAFT ZUR FÖRDERUNG DER ANGEWANDTEN FORSCHUNG E.V., Munich (DE)

(72) Inventors: Martin Moehrle, Berlin (DE); Victor Dolores Calzadilla, Berlin (DE); Marlene Zander, Berlin (DE); Francisco Soares, Berlin (DE)

(73) Assignee: FRAUNHOFER-GESELLSCHAFT ZUR FÖRDERUNG DER ANGEWANDTEN FORSCHUNG E.V., München (DE)

(*) Notice: Subject to any disclaimer, the term of this patent is extended or adjusted under 35 U.S.C. 154(b) by 0 days.

(21) Appl. No.: 16/461,338

(22) PCT Filed: Nov. 17, 2016

(86) PCT No.: PCT/EP2016/078001
§ 371 (c)(1),
(2) Date: May 15, 2019

(87) PCT Pub. No.: WO2018/091094
PCT Pub. Date: May 24, 2018

(65) Prior Publication Data
US 2019/0326729 A1    Oct. 24, 2019

(51) Int. Cl.
*H01S 5/00*     (2006.01)
*H01S 5/0625*   (2006.01)
(Continued)

(52) U.S. Cl.
CPC .......... *H01S 5/0625* (2013.01); *H01S 5/0208* (2013.01); *H01S 5/0421* (2013.01);
(Continued)

(58) Field of Classification Search
CPC .... H01S 5/0625; H01S 5/0208; H01S 5/0421; H01S 5/1228; H01S 5/343;
(Continued)

(56) References Cited

U.S. PATENT DOCUMENTS 6,191,464 B1    2/2001   Barnard
6,224,667 B1    5/2001   Kato
(Continued)

FOREIGN PATENT DOCUMENTS

JP    2012-2929 A     1/2012
WO    05114307 A1    12/2005

OTHER PUBLICATIONS

Hayashi et al., "Uncooled 43-Gb/s InGaAlAs Light Source for 10-km Transmission", IEEE Photonics Technology Letters, vol. 23, 2011.
(Continued)

*Primary Examiner* — Kinam Park
(74) *Attorney, Agent, or Firm* — Maschoff Brennan

(57) ABSTRACT

It is provided a method for fabricating an electroabsorption modulated laser comprising generating a single mode laser section and an electroabsorption modulator section, comprising fabricating at least one n-doped layer of the laser section and at least one n-doped layer of the modulator section; generating an isolating section for electrically isolating at least the n-doped layer of the laser section and the n-doped layer of the modulator section from one another. Generating the isolating section comprises epitaxially growing at least one isolating layer and structuring the isolating
(Continued)

Figure 1:
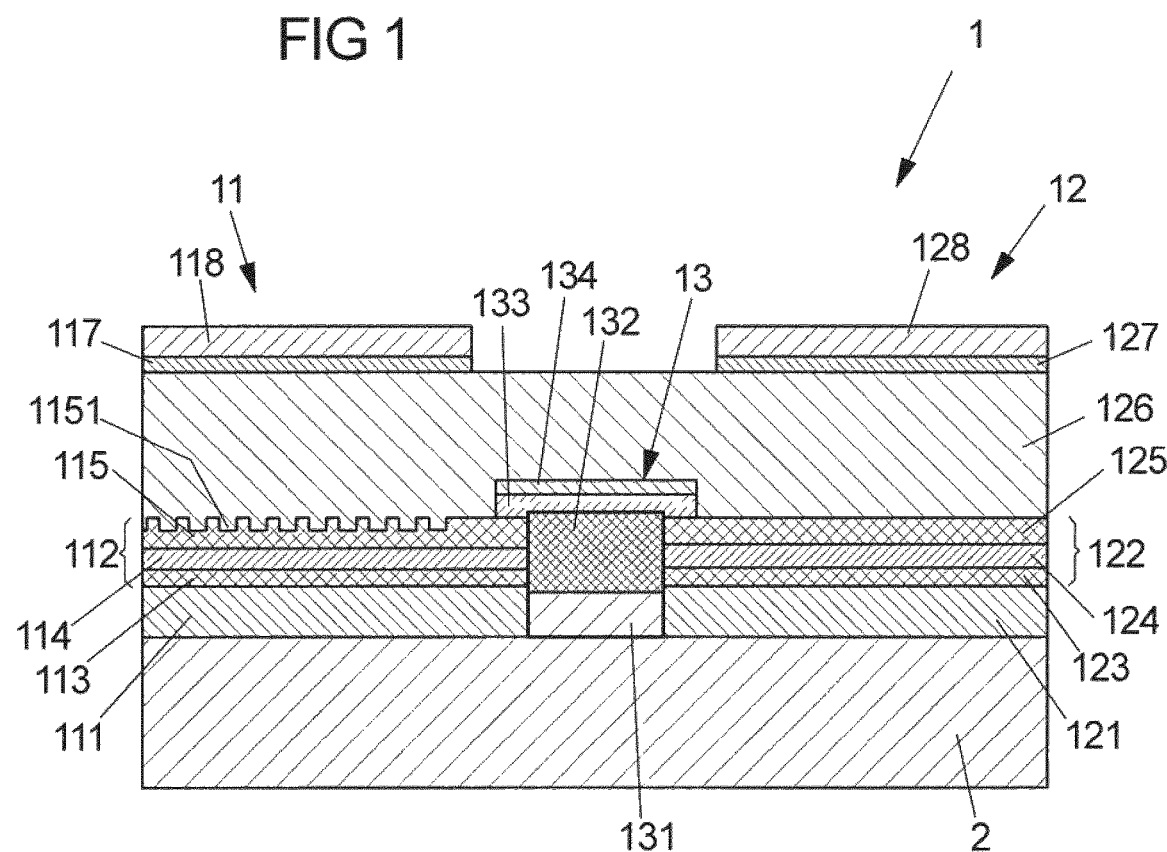

layer before the generation of the n-doped layer of the laser section and the n-doped layer of the modulator section.

20 Claims, 2 Drawing Sheets

(51) Int. Cl.
   *H01S 5/02* (2006.01)
   *H01S 5/042* (2006.01)
   *H01S 5/343* (2006.01)
   *H01S 5/12* (2021.01)
   *H01S 5/22* (2006.01)

(52) U.S. Cl.
   CPC ...... *H01S 5/06251* (2013.01); *H01S 5/06253* (2013.01); *H01S 5/06255* (2013.01); *H01S 5/06256* (2013.01); *H01S 5/343* (2013.01); *H01S 5/06258* (2013.01); *H01S 5/1228* (2013.01); *H01S 5/2206* (2013.01); *H01S 5/2228* (2013.01)

(58) Field of Classification Search
   CPC ............. H01S 5/06251; H01S 5/06253; H01S 5/06255; H01S 5/06256; H01S 5/06258
   See application file for complete search history.

(56) References Cited

U.S. PATENT DOCUMENTS

| | | | |
|---|---|---|---|
| 6,574,260 B2 | 6/2003 | Salvatore et al. | |
| 6,835,585 B2 | 12/2004 | Kim | |
| 6,999,489 B2 | 2/2006 | Peters | |
| 7,343,061 B2 | 3/2008 | Forrest et al. | |
| 2004/0264535 A1* | 12/2004 | Svenson | H01S 5/04256 372/50.1 |
| 2007/0223543 A1* | 9/2007 | Prosyk | B82Y 20/00 372/26 |
| 2007/0235715 A1 | 10/2007 | Makino | |
| 2008/0037607 A1* | 2/2008 | Hashimoto | B82Y 20/00 372/45.01 |
| 2009/0124058 A1* | 5/2009 | Agresti | H01S 5/0265 438/403 |
| 2009/0166807 A1* | 7/2009 | Yamatoya | H01S 5/0421 257/615 |
| 2010/0189154 A1* | 7/2010 | Makino | H01L 31/105 372/50.11 |
| 2014/0198816 A1 | 7/2014 | Margalit et al. | |

OTHER PUBLICATIONS

Ueda et al., "Low Driving Voltage Operation of MZI-Type EA Modulator Integrated with DFB Laser Using Optical Absorption and Interferometric Extinction", IEEE Journal of selected Topics in Quantum Electronics, vol. 21, 2015.

Tanaka, H., et al., "5-Gb/s performance of integrated light source consisting of lambda /4-shifted DFB laser and EA modulator with SI INP BH structure," Journal of Lightwave Technology, vol. 8, No. 9, pp. 1357-1362 (Sep. 1, 1990).

* cited by examiner

METHOD FOR FABRICATING AN ELCTRO-ABSORPTION MODULATED LASER AND ELECTRO-ABSORPTION MODULATED LASER

The invention relates to a method for fabricating an electro-absorption modulated laser according to the preamble of claim 1 and to an electro-absorption modulated laser according to the preamble of claim 21.

Electro-absorption modulated lasers (EMLs), in particular electro-absorption modulated DFB or DBR lasers, are used e.g. as high-speed transmitters of high data rate communication networks. EMLs comprise a laser section and an integrated electro-absorption modulator (EAM) for modulating light produced by the laser. Typically the p-contacts of laser and EAM are electrically isolated whereas both sections share a common n-contact. So-called single ended drivers are used to operate such EMLs. A significant lower power consumption could be realised if so-called differential drivers were used. However in that case both the p-contacts and the n-contacts of laser and EAM have to be electrically isolated.

For example, US 2004/0264535 A1 discloses an EML, wherein ion implantation is used for creating an isolating zone between the laser and the modulator section of the EML. However, this approach requires a complex technology and rather large EML devices.

The object of the invention is to facilitate the fabrication of an EML having an electrically isolated laser and modulator section.

According to the invention, a method for fabricating an electro-absorption modulated laser (EML) is provided, the method comprising
generating a single mode laser section and an electroabsorption modulator (EAM) section, comprising fabricating at least one n-doped layer of the laser section and at least one n-doped layer of the modulator section;
generating an isolating section for electrically isolating at least the n-doped layer of the laser section and the n-doped layer of the modulator section from one another, wherein
generating the isolating section comprises epitaxially growing at least one isolating layer and structuring the isolating layer before the generation of the n-doped layer of the laser section and the n-doped layer of the modulator section.

Epitaxially growing the isolating section between the n-doped layers of the laser and the modulator section e.g. permits the realization of short EML devices. For example, the device size (chip size) of an EML according to the invention compares to the size and costs of a conventional EML (without electrically separated n-layers).

For example, the single mode laser section is generated to be a DFB laser, a DBR laser or a multi-section tunable laser. The laser section and the modulator section may comprise the same semiconductor layers, wherein, however, a grating might be provided in at least one of the layers of the laser section as will be further described below.

The n-doped layers in particular are generated on an isolating or semi-isolating substrate (such as a Fe-doped InP substrate). The usage of an isolating or a semi-isolating substrate requires contact pads for electrically contacting the EML structure to be arranged directly on the substrate, which, in turn, may result in a reduction of parasitic capacitances and may allow higher modulation bandwidths. Generating the isolating section may comprise epitaxially growing at least one Fe-doped InP layer and at least one Fe-doped InGaAsP layer on the isolating or semi-isolating substrate such as a Fe-doped InP substrate. For example, a plurality of InGaAsP layer is fabricated (wherein e.g. at least one of the layers is Fe-doped).

The generation of the isolating section in addition comprises epitaxially growing at least one n-doped InP layer, at least one p-doped InP layer and at least one p-contact layer above the Fe-doped InP layer and the Fe-doped InGaAsP layer (e.g. on the Fe-doped InGaAsP layer). The at least one p-contact layer might be omitted.

According to another embodiment of the invention, generating the isolating section comprises epitaxially growing at least one Fe-doped InP layer and at least one p-contact layer on the Fe-doped InGaAsP layer. The at least one p-contact layer might be omitted.

The isolating layer may be structured (e.g. etched) in such a way that the isolating section obtains the form of a ridge having a width in a longitudinal direction of the electroabsorption modulated laser smaller than 3 µm, 5 µm or 7 µm. However, it is also possible that the at least one isolating layer is structured in such a way that the isolating section forms a broader region and/or obtains the form of a passive waveguide. The laser and the modulator section are optically coupled via the isolating layer (both vertically and laterally), wherein in the longitudinal direction essentially a free-beam coupling might be realized. The optical coupling losses through the isolating layer are small (depending on the width of the isolating layer). For example, a transmission efficiency of more than 98% may be obtained for an isolating bar having a width of 2 µm.

The n-doped layers in particular are grown on the same substrate as the isolating section and adjacent the isolating section using e.g. so-called butt-joint epitaxy. In particular, the n-doped layers of the laser and the modulator section are grown simultaneously. For example, the n-doped layers are n-doped InP layers.

Moreover, after generating the isolating section and the n-doped layers, an active layer stack of the laser section and an active layer stack of the modulator section may be epitaxially grown adjacent the isolating section and on top of the n-doped layer of the laser section and the modulator section, respectively. The active layer stacks each may comprise at least one n-doped waveguide layer, at least one active layer and at least one p-doped waveguide layer. For example, multi quantum well (MQW) layers, e.g. InGaAsP— or InGaAlAs-MQW layers, are grown as active layers. The MQW layers of the laser section may be different from the MQW layers of the modulator section.

Further, the thickness (i.e. the height perpendicular to the substrate) of the isolating section may be greater than the thickness of the active layer stacks. In particular, if the isolating section comprises the above-mentioned Fe-doped InGaAsP layer, the thickness of this Fe-doped InGaAsP layer might be smaller than or may equal the thickness of the active layer stacks.

According to another embodiment of the invention, at least one cover layer is grown on the isolating section and the active layer stacks (e.g. on at least a portion of the active layer stack of the laser section and on at least a portion of the active layer stack of the modulator section). The cover layer thus covers the joints between the active layer stacks and the isolating section. For example, a Fe-doped InP layer and/or an n-doped InP layer is grown as cover layer. The cover layer in particular is useful if the active layer stacks comprise aluminium.

The cover layer may also be initially generated on a larger region of the laser and/or modulator section and partially removed in the laser and/or the modulator section (wherein it still might cover the joint between the active layer stacks and the isolating section).

Moreover, a grating may be generated in the at least one p-doped waveguide layer (index coupling) mentioned above after the removal of the cover layer. More particularly, the grating is generated in the laser section, e.g. as a part of a DFB or DBR laser. The grating might also be generated in the at least one active layer (e.g. in an MQW-structure) of the laser section (complex coupling).

Further, at least one p-doped layer is grown simultaneously above the active layers stacks and the isolating section. However, it is also conceivable that the isolating section comprises a top p-doped layer and the p-doped layers above the active layers stacks of the laser and the modulator section are grown adjacent the p-doped layer of the isolating section.

Furthermore, contact layers may be generated on the p-doped layer, wherein metal contacts may be arranged on the contact layers.

The invention also relates to an electro-absorption modulated laser (EML), comprising
a single mode laser section having at least one n-doped layer;
an electroabsorption modulator (EAM) section comprising at least one n-doped layer;
an isolating section electrically isolating at least the n-doped layer of the laser section and the n-doped layer of the modulator section from one another, wherein the isolating section comprises at least one epitaxially grown isolating layer.

The electro-absorption modulated laser according to the invention may be formed as a ridge waveguide and/or buried heterostructure component.

It is noted that embodiments of the invention described above with respect to the method for fabricating an electroabsorption modulated laser may also be realized in the electroabsorption modulated laser. For example, the isolating section may comprise an epitaxially grown Fe-doped InP and InGaAsP layer, wherein an active layer stack of the laser section and an active layer stack of the modulator section is arranged adjacent the isolating section on top of the n-doped layer of the laser section and the modulator section.

The invention further relates to an arrangement comprising an electroabsorption modulated laser as described above and a differential driver for driving the electroabsorption modulated laser, the differential driver being connected to the electroabsorption modulated laser.

Figure 2:
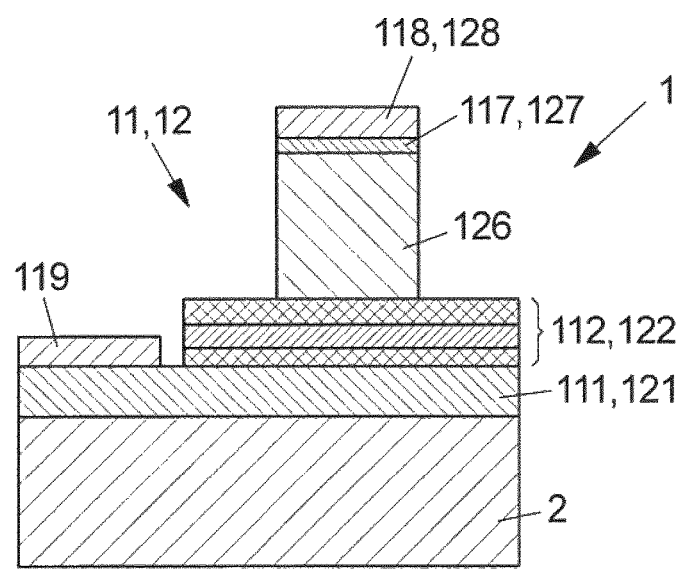
Figure 3:
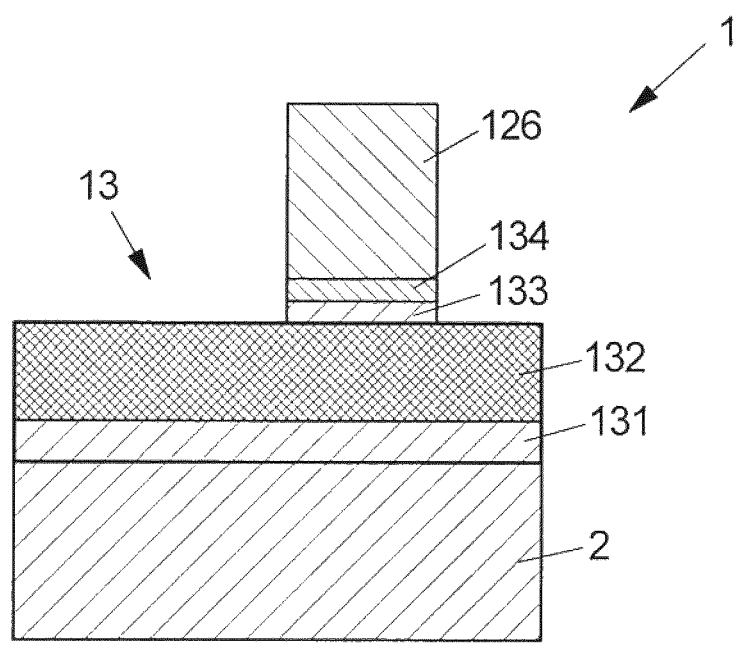

Embodiments of the invention are explained in more detail hereinafter with reference to the drawings, which show FIG. 1 a cross-section of an electro-absorption modulated laser (EML) according to an embodiment of the invention;

FIG. 2 a cross-section of the EML along line A-A (laser section) or C-C (modulator section) in FIG. 1; and FIG. 3 a cross-section of the EML along line B-B in FIG. 1 through the isolating section.

The electro-absorption modulated laser 1 illustrated in FIG. 1 comprises a single mode laser section in the form of a DFB laser section 11 and an electro-absorption modulator section (EAM section) 12. Both the DFB laser section 11 and the modulator section 12 are arranged on a common isolating or semi-isolating substrate 2, e.g. a Fe-doped InP substrate.

Further, the EML 1 comprises an n-doped semiconductor layer 111 (e.g. an n-doped InP layer) of the laser section 11 and an n-doped semiconductor layer 121 (e.g. an n-doped InP layer) of the modulator section 12. Further, the EML 1 comprises an isolating section 13 that in combination with the isolating or semi-isolating substrate 2 electrically isolates the n-doped layer 111 of the laser section 11 and the n-doped layer 112 of the modulator section 12 from one another.

The isolating section 13 comprises layers which were epitaxially grown and structured before the n-doped layers 111, 112 were generated. More particularly, the isolating section 13 comprises a Fe-doped InP isolating layer 131 and an Fe-doped InGaAsP isolating layer 132, wherein the layers 131, 132 were structured (e.g. dry or wet etched) in such a way that the isolating section 13 forms a bar extending perpendicular to the longitudinal direction of laser 1 (i.e. perpendicular to the light propagation direction) and having a rather small width (with respect to the longitudinal direction of laser 1) of e.g. some micrometers (for example, less than 3 μm, 5 μm or 7 μm). More than the two isolating layers 131, 132 shown in FIG. 1 could be provided.

After the fabrication of the layers 131, 132 the n-doped layers 111, 121 are epitaxially grown on opposite sides of the isolating section 13 and adjacent the isolating section 13 using butt joint epitaxy. Further, also adjacent the isolating region 13, an active layer stack 112 of the laser section 11 and an active layer stack 122 of the modulator section 12 is epitaxially grown on top of the n-doped layers 111, 112. The active layer stacks 112, 122 each comprise an n-doped waveguide layer 113, 123, at least one active layer 114, 124 and a p-doped waveguide layer 115, 125. A grating 1151 is provided in the p-doped waveguide layer 115 of the DFB laser section 11. The thickness of the upper isolating layer 132 may be greater than the total thickness of the active layer stacks 112, 122.

The active layers 114, 124 each may comprise a multi quantum well (MQW) structure, e.g. an InGaAsP-MQW or an InGaAlAs-MQW structure. The active layers 114, 124 of the laser and the modulator section 11, 12 may be different, e.g. they comprise different MQW layers. The n-doped layers 111, 121 and the active layer stacks 112, 123 of the laser section 11 and the modulator section 12 are grown simultaneously such that the height (thickness) of these in the laser section 11 corresponds to the thickness of theses layers in the modulator section 12.

The isolating region 13 and parts of the p-doped layer 115, 125 of the laser section 11 and the modulator section 2 of are covered by (relatively thin) cover layers 133, 134, the cover layers 133, 134 thus covering a butt joint interface between the active layer stacks 112, 122 and the isolating region 13. The cover layers 133, 134 may initially cover larger portions or all of the active layer stacks 112, 121, wherein these layers are partially removed (at least in the laser section 11) and the grating 1151 is generated (e.g. etched) in the p-doped waveguide layer 114.

Further, a common p-doped InP layer 126 is generated by overgrowing the active layer stacks 112, 122 and the cover layers 133, 134, the p-doped InP layer 126 thus extending in the laser and the modulator section 11, 12 and in the isolating section 13 (on the cover layers 133, 134). The n-doped InP layer 134 counteracts a diffusion of Zn doping material from the InP layer 126 into the isolating section 13. Contact layers 117, 127 are generated on the InP layer 126 and removed between the laser and the modulator section 11, 12 in order to electrically isolate the p-doped side of EML 1. Subsequently, the layers of EML 1 (in particular the layer stacks 112, 122, the p-doped InP layer 126 and the contact layers 117, 127) are structured to form longitudinally extending ridges (see FIGS. 2 and 3). Metal contacts (e.g. gold contacts) 118, 128 are then deposited on the ridge-shaped contact layers 117, 127. The EML 1 thus is a ridge waveguide device, wherein as illustrated in FIGS. 2 and 3 the active layers stacks 112, 122, the p-doped InP layer 126 and the contact layers 117, 127 form a ridge that is broader than the p-doped InP layer 126 and the contact layers 117, 127.

As further depicted in FIG. 2, n-contact metal pads 119, 129 are arranged on the n-doped InP layers 111, 121 of the laser section 11 and the modulator section 12, respectively, next to the active layer stacks 112, 122 and p-doped InP ridge 126.

It is noted that the material components of the semiconductor layers of EML 1 shown in FIGS. 1 to 3 are only exemplary. Other materials might also be used.

The invention claimed is:

1. A method for fabricating an electroabsorption modulated laser, comprising:
    generating a single mode laser section and an electroabsorption modulator section, comprising fabricating at least one n-doped layer of the laser section and at least one n-doped layer of the modulator section;
    generating an isolating section for electrically isolating at least the n-doped layer of the laser section and the n-doped layer of the modulator section from one another,
    wherein generating the isolating section comprises epitaxially growing at least one isolating layer and structuring the isolating layer before the generation of the n-doped layer of the laser section and the n-doped layer of the modulator section,
    wherein after generating the isolating section and the n-doped layers, an active layer stack of the laser section and an active layer stack of the modulator section are epitaxially grown adjacent the isolating section and on top of the n-doped layer of the laser section and the n-doped layer of the modulator section, respectively.

2. The method as claimed in claim 1, wherein the laser section is generated to be a DFB laser, a DBR laser or a multi-section tunable laser.

3. The method as claimed in claim 1, wherein generating the isolating section comprises epitaxially growing at least one Fe-doped InP layer and at elast one Fe-doped InGaAsP layer.

4. A method for fabricating an electroabsorption modulated laser, comprising:
    generating a single mode laser section and an electroabsorption modulator section, comprising fabricating at least one n-doped layer of the laser section and at least one n-doped layer of the modulator section;
    generating an isolating section for electrically isolating at least the n-doped layer of the laser section and the n-doped layer of the modulator section from one another,
    wherein generating the isolating section comprises epitaxially growing at least one isolating layer and structuring the isolating layer before the generation of the n-doped layer of the laser section and the n-doped layer of the modulator section,
    wherein generating the isolating section comprises epitaxially growing at least one Fe-doped InP layer and at elast one Fe-doped InGaAsP layer,
    wherein generating the isolating section in addition comprises at least one of
    epitaxially growing at least one n-doped InP layer, at least one p-doped InP layer and at least one p-contact layer above the Fe-doped InP layer and the Fe-doped InGaAsP layer And
    epitaxially growing at least one Fe-doped InP layer and at least one p-contact layer above the Fe-doped InP layer and the Fe-doped InGaAsP layer.

5. The method as claimed in claim 1, wherein the at least one isolating layer) is structured in such a way that the isolating section obtains the form of at least one of
    a bar having a width in a longitudinal direction of the electroabsorption modulated laser smaller than 3 µm, 5 µm or 7 µm, and
    a passive waveguide.

6. The method as claimed in claim 1, wherein the n-doped layers are n-doped InP layers epitaxially grown on an isolating or semi-isolating InP substrate.

7. The method as claimed in claim 1, wherein the n-doped layer of the laser section and the n-doped layer of modulator section are epitaxially grown adjacent the isolating section and after generating the isolating section and the n-doped layers, an active layer stack of the laser section and an active layer stack of the modulator section is epitaxially grown adjacent the isolating section and on top of the n-doped layer of the laser section and the n-doped layer of the modulator section, respectively.

8. The method as claimed in claim 7, wherein the epitaxially grown active layer stacks each comprise at least one n-doped waveguide layer, at least one active layer and at least one p-doped waveguide layer.

9. The method as claimed in claim 8, wherein InGaAsP— or InGaAlAs-MQW layers are grown as active layers.

10. The method as claimed in claim 8, wherein MQW layers are grown as active layers, wherein the MQW layers of the laser section are different from the MQW layers of the modulator section.

11. The method as claimed in claim 7, wherein the thickness of the isolating section is greater than the thickness of the active layer stacks.

12. The method as claimed in claim 7, wherein generating the isolating section in addition comprises epitaxially growing at least one n-doped InP layer, at least one p-doped InP layer and at least one p-contact layer above the Fe-doped InP layer and the Fe-doped InGaAsP layer, wherein the thickness of the Fe-doped InGaAsP layer is smaller than or equals the thickness of the active layer stacks.

13. The method as claimed in claim 7, wherein at least one cover layer is grown on the isolating section and the active layer stacks.

14. The method as claimed in claim 13, wherein a Fe-doped InP layer and/or an n-doped InP layer is grown as cover layer.

15. The method as claimed in claim 13, wherein the cover layer is at least partially removed in the laser and/or the modulator section.

16. The method as claimed in claim 7, wherein the epitaxially grown active layer stacks each comprise at least one n-doped waveguide layer, at least one active layer and at least one p-doped waveguide layer, wherein at least one of
    the cover layer is at least partially removed in the laser and/or the modulator section and wherein a grating is generated in the at least one p-doped waveguide layer after the removal of the cover layer, and
    a grating is generated in the at least one active layer of the laser section.

17. The method as claimed in claim 7, wherein at least one p-doped layer is grown above the active layers stacks and the isolating section.

18. An electroabsorption modulated laser comprising
a single mode laser section having at least one n-doped layer;
an electroabsorption modulator section comprising at least one n-doped layer;
an isolating section electrically isolating at least the n-doped layer of the laser section and the n-doped layer of the modulator section from one another,
wherein the isolating section comprises at least one epitaxially grown isolating layer; and
an active layer stack of the laser section and an active layer stack of the modulator section are epitaxially grown adjacent the isolating section and on top of the n-doped layer of the laser section and the n-doped layer of the modulator section, respectively.

19. The electroabsorption modulated laser as claimed in claim 18, formed as at least one of a ridge waveguide component and a buried heterostructure.

20. The arrangement comprising an electroabsorption modulated laser as claimed in claim 18 and a differential driver connected to the electroabsorption modulated laser.

* * * * *